(12) United States Patent
Jung (10) Patent No.: US 8,183,069 B2
(45) Date of Patent: May 22, 2012

(54) METHOD OF MANUFACTURING ORGANIC LIGHT EMITTING DISPLAY DEVICE

(75) Inventor: In-Young Jung, Gyunggi-Do (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 12/929,912

(22) Filed: Feb. 24, 2011

(65) Prior Publication Data
US 2011/0229994 A1    Sep. 22, 2011

(30) Foreign Application Priority Data

Mar. 20, 2010    (KR) .................. 10-2010-0028597

(51) Int. Cl.
*H01L 21/00* (2006.01)
(52) U.S. Cl. ............... 438/29; 257/40; 257/59; 257/72; 257/E51.022; 313/306; 428/690; 438/34; 438/35; 445/24
(58) Field of Classification Search ............. 257/40, 257/59, 72, E51.022; 313/306; 428/690; 438/29, 34, 35; 445/24
See application file for complete search history.

(56) References Cited

U.S. PATENT DOCUMENTS

| | | | |
|---|---|---|---|
| 7,510,455 B2 | 3/2009 | Suzuki | |
| 2005/0142976 A1 | 6/2005 | Suzuki | |
| 2006/0214573 A1 | 9/2006 | Maeda et al. | |
| 2009/0101906 A1 | 4/2009 | Hosoya et al. | |
| 2009/0215354 A1 | 8/2009 | Maeda et al. | |
| 2011/0317429 A1* | 12/2011 | Aiba et al. | 362/296.01 |

FOREIGN PATENT DOCUMENTS

| | | |
|---|---|---|
| JP | 2006-269329 A | 10/2006 |
| KR | 10 2005-0067055 A | 6/2005 |
| KR | 10 2005-0113422 A | 12/2005 |
| KR | 10 2007-0072187 A | 7/2007 |
| KR | 10 2009-0041317 A | 4/2009 |

\* cited by examiner

*Primary Examiner* — Asok Sarkar
(74) *Attorney, Agent, or Firm* — Lee & Morse, P.C.

(57) ABSTRACT

A method of manufacturing an organic light emitting display device includes providing a substrate, the substrate including a first electrode on which a first photosensitive layer is formed, a second electrode on which a second photosensitive layer is formed, and an exposed third electrode, coating an organic layer on the substrate, and carrying out an ashing process to remove the organic layer and the second photosensitive layer and to partially remove the first photosensitive layer so as to avoid exposing the upper surface of the first electrode.

20 Claims, 8 Drawing Sheets

METHOD OF MANUFACTURING ORGANIC LIGHT EMITTING DISPLAY DEVICE

BACKGROUND

1. Field

Embodiments relate to a method of manufacturing an organic light emitting display device.

2. Description of the Related Art

Organic light emitting display devices are self-luminous display devices that emit light by applying a voltage to an organic layer including an organic emission layer interposed between an anode and a cathode and, thereby, recombining electrons with holes in the organic emission layer. The organic light emitting display device is light weight and is easily made to be thin compared with cathode ray tubes (CRTs) or liquid crystal displays (LCDs). Also, the organic light emitting display device has a wide viewing angle, rapid response speeds, and low power consumption, and thus has recently been highlighted as a next generation display device.

In a full-color organic light emitting display device, there may be a difference in luminous efficiency in each pixel, that is, in each color. For example, green light emitting materials from among red, green, and blue light emitting materials may show the best luminous efficiency and, next, the red light emitting materials show excellent luminous efficiency. Accordingly, various attempts to control the thicknesses of organic layers and thus to obtain maximum efficiency and brightness have been made.

A fine metal mask is used to make the thicknesses of organic layers different in each pixel. However, such a process is complex and product defects such as stain defects or dark spot defects may increase so that a yield may be reduced.

SUMMARY

It is a feature of an embodiment to provide a method of manufacturing an organic light emitting display device having a resonance structure so as to reduce defects and improve productivity.

At least one of the above and other features and advantages may be realized by providing a method of manufacturing an organic light emitting display device, the method including providing a substrate, the substrate including a first electrode on which a first photosensitive layer is formed, a second electrode on which a second photosensitive layer is formed, and an exposed third electrode, coating an organic layer on the substrate, and carrying out an ashing process to remove the organic layer and the second photosensitive layer and to partially remove the first photosensitive layer so as to avoid exposing the upper surface of the first electrode.

The method may further include partially removing the second electrode using the first photosensitive layer that is partially removed as an etching mask, and then completely removing the first photosensitive layer that is partially removed.

The method may further include, after completely removing the first photosensitive layer that is partially removed, forming a first organic emission layer on the first electrode, forming a second organic emission layer on the second electrode that is partially removed, and forming a third organic emission layer on the third electrode.

The method may further include forming opposite electrodes on the first, second, and third organic emission layers. The first electrodes and the opposite electrodes may be configured such that light emitted from the first organic emission layer resonates between the first electrode and the opposite electrode, light emitted from the second organic emission layer resonates between the second electrode and the opposite electrode, and light emitted from the third organic emission layer resonates between the third electrode and the opposite electrode.

The first organic emission layer may emit red light, the second organic emission layer may emit green light, and the third organic emission layer may emit blue light.

The first, second, and third electrodes may include pixel electrodes, and the first and second electrodes may be initially formed to each further include a first auxiliary electrode on the pixel electrode and a second auxiliary electrode on the first auxiliary electrode.

The method may further include removing the second auxiliary electrode of the second electrode using the first photosensitive layer that is partially removed as an etching mask.

The thickness of the first photosensitive layer may be larger than the thickness of the second photosensitive layer.

At least one of the above and other features and advantages may also be realized by providing a method of manufacturing an organic light emitting display device, the method including providing a substrate, the substrate including a first pixel region, a second pixel region, a third pixel region, and pixel defining regions, a first pixel electrode being formed in the first pixel region, a second pixel electrode being formed in the second pixel region, and a third pixel electrode being formed in the third pixel region, the pixel defining regions being disposed between the first pixel region, second pixel region, and third pixel region, sequentially forming a first auxiliary electrode layer, a second auxiliary electrode layer, and a photosensitive layer in the stated order on the substrate, patterning the photosensitive layer so as to partially remove the photosensitive layer in the second pixel region so as to avoid exposing the second auxiliary electrode layer of the second pixel region while removing the photosensitive layer on the third pixel area and the pixel defining regions, etching the first and second auxiliary electrode layers using the patterned photosensitive layer as an etching mask, and then forming an organic layer on the substrate, carrying out an ashing process so as to partially remove the photosensitive layer in the first pixel region so as to avoid exposing the second auxiliary electrode layer in the first pixel region while removing the organic layer and the photosensitive layer in the second pixel region, removing the second auxiliary electrode layer in the second pixel region using the ashed photosensitive layer as an etching mask, and removing the ashed photosensitive layer.

The method may further include forming a first organic emission layer on the second auxiliary electrode layer of the first pixel region, a second organic emission layer on the first auxiliary electrode layer of the second pixel region, and a third organic emission layer on the third electrode of the third pixel region, and forming opposite electrode layers on the first, second, and third organic emission layers.

The first electrodes and the opposite electrodes may be configured such that light emitted from the first organic emission layer resonates between the first pixel electrode and the opposite electrode, light emitted from the second organic emission layer resonates between the second pixel electrode and the opposite electrode, and light emitted from the third organic emission layer resonates between the third pixel electrode and the opposite electrode.

The first, second, and third pixel electrodes may include semi-permeable metal layers and the opposite electrode layer includes a reflective metal layer, or the first, second, and third pixel electrodes may include reflective metal layers and the opposite electrode layer includes a semi-permeable metal layer, or the first, second, and third pixel electrodes and the opposite electrode layer may include semi-permeable metal layers.

The first auxiliary electrode layer and the second auxiliary electrode layer may be formed of different transparent conductors.

The first auxiliary electrode layer may include amorphous-Indium tin oxide (ITO) and the second auxiliary electrode layer may include aluminum-doped zinc oxide (AZO).

The first, second, and third pixel electrodes may each include a first ITO layer, a metal layer formed on the first ITO layer, and a second ITO layer formed on the metal layer, and the metal layer may be a reflective metal layer or a semi-permeable metal layer.

The organic layer may be formed of the same material as the photosensitive layer.

Patterning the photosensitive layer may include exposing the photosensitive layer using a single half-tone mask that includes a shaded region, a half-tone region, and a transparent region, the shaded region corresponding to the first pixel region, the half-tone region corresponding to the second pixel region, and the transparent region corresponding to the pixel defining region.

The substrate may include a plurality of thin film transistors each of which is electrically respectively connected to the first, second, and third pixel electrodes, and an insulating layer disposed on the plurality of thin film transistors, and the first, second, and third pixel electrodes may be formed on the insulating layer to be spaced apart from each other in a matrix form.

The insulating layer may include an acryl-based compound and the organic layer protects the insulating layer in the ashing process.

At least one of the above and other features and advantages may also be realized by providing a method of manufacturing an organic light emitting display device, the method including providing a substrate, the substrate including a first pixel region, a second pixel region, a third pixel region, and pixel defining regions, a first pixel electrode being formed in the first pixel region, a second pixel electrode being formed in the second pixel region, and a third pixel electrode being formed in the third pixel region, the pixel defining regions being disposed between the first pixel region, the second pixel region, and the third pixel region, sequentially forming a first auxiliary electrode layer, a second auxiliary electrode layer, and a photosensitive layer in the stated order on the substrate, forming a first photosensitive layer pattern so as to partially remove the photosensitive layer in the second pixel region so as to avoid exposing the second auxiliary electrode layer of the second pixel region while removing the photosensitive layer on the third pixel region and the pixel defining regions, removing the first and second auxiliary electrode layers in the third pixel region and the pixel defining regions using the first photosensitive layer pattern, and then forming an organic layer on the substrate, forming a second photosensitive layer pattern so as to remove the organic layer and to partially remove the photosensitive layer in the first pixel region so as to avoid exposing the second auxiliary electrode layer of the first pixel region while removing the photosensitive layer on the second pixel region, removing the second auxiliary electrode layer in the second pixel region by using the second photosensitive layer pattern as an etching mask, and removing the second photosensitive layer pattern.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Korean Patent Application No. 10-2010-0028597, filed on Mar. 30, 2010, in the Korean Intellectual Property Office, and entitled: "Method of Manufacturing Organic Light Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Unless defined differently, the terminologies used in the description are for the purpose of describing particular embodiments only, have the same meaning as generally understood by those skilled in the art, and are not intended to be limiting of example embodiments. As used herein, the singular forms are intended to include the plural forms as well, unless the context clearly indicates otherwise. Also, in the description, when it is described that a layer is disposed on another layer, the layer may be directly disposed on the other layer or a third layer may be interposed therebetween. In addition, the term "and/or" includes any and all combinations of one or more of the associated listed items.

It will be further understood that the terms "includes" and/or "including," when used herein, specify the presence of stated steps, operations, elements, components, and/or groups thereof, but do not preclude the presence or addition of one or more other steps, operations, elements, components, and/or groups thereof.

It will be understood that, although the terms first, second, third, etc., may be used herein to describe various elements, components, regions, layers, and/or sections, these elements, components, regions, layers, and/or sections should not be limited by-these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

In the drawings, like reference numerals denote like elements, and the thicknesses of layers and regions may be exaggerated for clarity. For example, variations from the shapes of the illustrations as a result of manufacturing techniques and/or tolerances are to be expected. Thus, the example embodiments should not be construed as limited to the particular shapes of regions illustrated herein.

Figure 1:
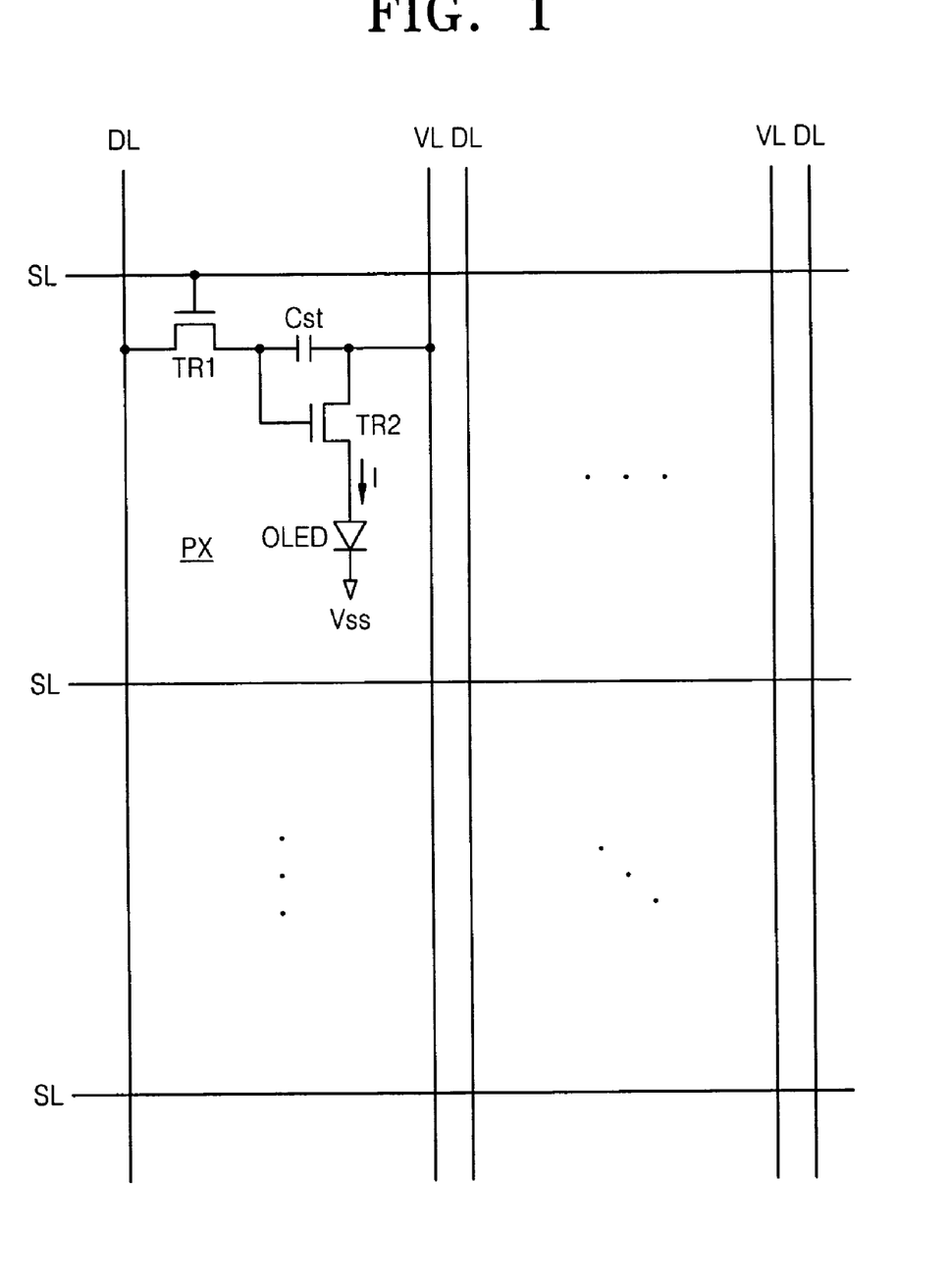
FIG. 1 illustrates an equivalent circuit diagram of a pixel in an organic light emitting display device, according to an embodiment.

FIG. 1 illustrates an equivalent circuit diagram of a pixel in an organic light emitting display device, according to an embodiment.

Referring to FIG. 1, the organic light emitting display device according to the current embodiment may include a plurality of pixels PX arranged in a matrix form. The plurality of pixels PX may be connected to a plurality of signal lines, e.g., a plurality of scan, data, and driving voltage lines (SL, DL, and VL, respectively).

The signal lines may include the plurality of scan lines SL, the plurality of data lines DL, and the plurality of driving voltage lines VL, wherein the scan lines SL may transmit scan signals (or gate signals), the data lines DL may transmit data signals, and the driving voltage lines VL may transmit driving voltages. The scan lines SL may extend approximately in a row direction substantially in parallel to each other. The data lines DL and the driving voltage lines VL may extend approximately in a column direction substantially in parallel to each other. Although not illustrated, according to the configuration of the pixels PX, other various conductive lines, in addition to the scan lines SL, the data lines DL, and the driving voltage lines VL, may be included.

Each of the pixels PX may include, e.g., a switching thin film transistor TR1, a driving thin film transistor TR2, a storage capacitor Cst, and an organic light emitting diode (OLED).

The switching thin film transistor TR1 may include a control terminal connected to the scan line SL, an input terminal connected to the data line DL, and an output terminal connected to the driving thin film transistor TR2. The switching thin film transistor TR1 may transmit a data signal applied to the data line DL to the driving thin film transistor TR2 in response to the scan signal applied to the scan line SL.

The driving thin film transistor TR2 may include a control terminal connected to the switching thin film transistor TR1, an input terminal connected to the driving voltage line VL, and an output terminal connected to the OLED. The driving thin film transistor TR2 may provide an output current I, a magnitude of which may vary according to a voltage between the control terminal and the output terminal.

The storage capacitor Cst may be connected between the control terminal and the input terminal of the driving thin film transistor TR2, and may charge and maintains the data signal applied to the control terminal of the driving thin film transistor TR2 after the switching thin film transistor TR1 is turned off.

The OLED may includes an anode connected to the output terminal of the driving thin film transistor TR2 and a cathode connected to a common voltage Vss. The OLED may emit light at different light intensities according to the output current I of the driving thin film transistor TR2 to display an image.

Figure 2:
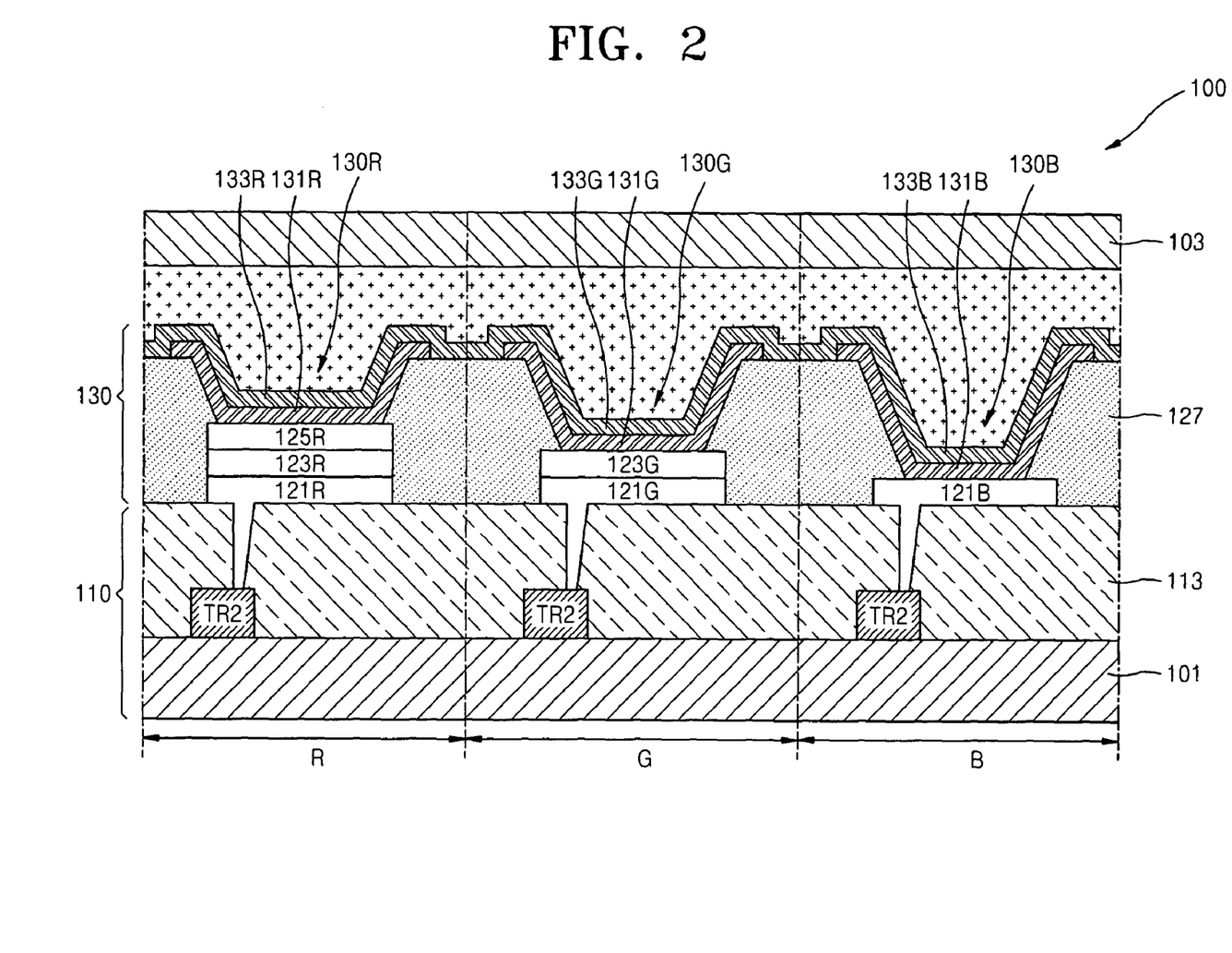
FIG. 2 illustrates a schematic cross-sectional diagram of an organic light emitting display device including pixels of FIG. 1, according to an embodiment.

FIG. 2 illustrates a schematic cross-sectional diagram of an organic light emitting display device 100 including pixels PX of FIG. 1, according to an embodiment.

Referring to FIG. 2, the organic light emitting display device 100 according to the current embodiment may include a substrate 110, a sealing member 103, and an organic light emitting unit 130 interposed between the substrate 110 and the sealing member 103.

The substrate 110 may include a base substrate 101, a plurality of driving thin film transistors TR2, and an insulating layer 113. The substrate 110 may include a first region R, a second region G, and a third region B. The first, second, and third regions R, G, and B may respectively correspond to pixels that emit light with different colors, e.g., red, green, and blue, respectively. The organic light emitting display device 100 may be an active matrix (AM) type, in which case the substrate 110 may include thin film transistors, as will be described below.

The base substrate 101 may be formed of a material such as transparent glass, a plastic sheet, or silicon. Also, the base substrate 101 may be flexible or may not be flexible. In addition, the base substrate 101 may be transparent or opaque. Embodiments are not limited thereto. In an implementation, the base substrate 101 may be formed of a metal plate.

The driving thin film transistors TR2 may be formed on each of the first, second, and third regions R, G, and B of the base substrate 101. The switching thin film transistors TR1 and the storage capacitors Cst may be formed on the base substrate 101, in addition to the driving thin film transistors TR2. However, for convenience of understanding, the switching thin film transistors TR1 and the storage capacitors Cst are not illustrated.

The switching thin film transistors TR1 and/or the driving thin film transistors TR2 may each include an active layer (not illustrated), a gate electrode (not illustrated) disposed above or below the active layer in parallel with the active layer, a gate insulating layer (not illustrated) interposed between the active layer and the gate electrode, and source/drain electrodes (not illustrated) electrically connected to both ends of the active layer. The configuration of the switching thin film transistors TR1 and/or the driving thin film transistors TR2 is not limited thereto and structures of various forms of thin film transistors may be applied. Herein, for convenience of understanding, the driving thin film transistors TR2 are illustrated as blocks.

The insulating layer 113 may be formed on the driving thin film transistors TR2. Via holes partially exposing the driving thin film transistors TR2 may be formed in each of the first, second, and third regions R, G, and B of the insulating layer 113. The insulating layer 113 may include a layer formed of photosensitive organic material such as an acryl-based compound and may be planarized in order to remove steps generated by lower structures such as thin film transistors.

The insulating layer 113 may include color filters (not illustrated) that may be formed in each of the first, second, and third regions R, G, and B, an interlayer insulating layer (not illustrated) interposed between a gate electrode (not illustrated) and/or an active layer (not illustrated) and source/drain electrodes (not illustrated), and/or a passivation film (not illustrated) for protecting thin film transistors. In FIG. 2, the insulating layer 113 is shown as a single layer; however, the insulating layer 113 may include multi-layers in which layers and/or films are stacked.

The sealing member 103 may be disposed on the organic light emitting unit 130 and may be adhered to the substrate 110. As illustrated in FIG. 2, the sealing member 103 may be spaced apart from the organic light emitting unit 130 and may be adhered to the substrate 110 by an adhesive (not illustrated). The sealing member 103 may be, e.g., a glass substrate or a plastic substrate formed of, for example, acryl. In a top emission type organic light emitting display device, the sealing member 103 may be formed of an electrical insulating material having high permeability for light generated from the organic light emitting unit 130. For example, the sealing member 103 may include transparent glass, for example, alkali glass or non-alkali gas, transparent ceramics, or polymers, for example, polyethylene terephthalate, polycarbonate, polyether sulfone, polyvinyl fluoride (PVF), poly acrylate, or oxide zirconia, or quartz.

The organic light emitting unit 130 may be interposed between the substrate 110 and the sealing member 103. The organic light emitting unit 130 may include a plurality of first, second, and third pixel units 130R, 130G, and 130B. The first, second, and third pixel units 130R, 130G, and 130B may be disposed in parts of the first, second, and third regions R, G, and B to correspond to the first, second, and third regions R, G, and B, respectively, for example, at the center of the first, second, and third regions R, G, and B. The first pixel unit 130R, the second pixel unit 130G, and the third pixel unit 130B may emit light with different colors. For example, the first pixel unit 130R may emit red light, the second pixel unit 130G may emit green light, and the third pixel unit 130B may emit blue light.

The first, second, and third pixel units 130R, 130G, and 130B may include first, second, and third pixel electrodes 121R, 121G, and 121B, respectively, first, second, and third organic emission layers 131R, 131G, and 131B, respectively, and first, second, and third opposite electrode layers 133R, 133G, and 133B, respectively. The first pixel unit 130R may further include first and second auxiliary electrodes 123R and 125R interposed between the first pixel electrode 121R and the first organic emission layer 131R. The second pixel unit 130G may further include a first auxiliary electrode 123G interposed between the second pixel electrode 121G and the second organic emission layer 131G.

The first, second, and third pixel electrodes 121R, 121G, and 121B may be disposed on the substrate 110 so as to correspond to the first, second, and third pixel units 130R, 130G, and 130B, respectively. The first, second, and third pixel electrodes 121R, 121G, and 121B may be electrically connected to the output terminals of the driving thin film transistors TR2 through a via hole, respectively. The first, second, and third opposite electrode layers 133R, 133G, and 133B may be formed on the first, second, and third pixel electrodes 121R, 121G, and 121B. The first, second, and third organic emission layers 131R, 131G, and 131B may be interposed between the first, second, and third opposite electrode layers 133R, 133G, and 133B and the first, second, and third pixel electrodes 121R, 121G, and 121B, respectively.

The first, second, and third pixel electrodes 121R, 121G, and 121B and the first, second, and third opposite electrode layers 133R, 133G, and 133B respectively apply voltages to the first, second, and third organic emission layers 131R, 131G, and 131B interposed between the first, second, and third pixel electrodes 121R, 121G, and 121B and the first, second, and third opposite electrode layers 133R, 133G, and 133B, respectively. The first, second, and third pixel electrodes 121R, 121G, and 121B and the first, second, and third opposite electrode layers 133R, 133G, and 133B may reflect or transmit light emitted from the first, second, and third organic emission layers 131R, 131G, and 131B.

When the organic light emitting display device 100 is a top emission type organic light emitting display device, the first, second, and third pixel electrodes 121R, 121G, and 121B may reflect light emitted from the first, second, and third organic emission layers 131R, 131G, and 131B, and light from the first, second, and third organic emission layers 131R, 131G, and 131B may be transmitted or partially transmitted by the first, second, and third opposite electrode layers 133R, 133G, and 133B. In this case, the first, second, and third pixel electrodes 121R, 121G, and 121B may each be formed of a reflective metal, for example, a metal such as silver, aluminum, gold, platinum, or chromium, or an alloy containing the metal. The first, second, and third opposite electrode layers 133R, 133G, and 133B may each be formed of a semi-permeable metal, for example, an alloy of magnesium Mg and silver Ag, a metal such as silver, aluminum, gold, platinum, or chromium, or an alloy containing the metals. When the first, second, and third opposite electrode layers 133R, 133G, and 133B are formed of such a semi-permeable metal, the first, second, and third opposite electrode layers 133R, 133G, and 133B may each have a thickness that may reach reflectivity of 5% or above and permeability of 50%.

When the organic light emitting display device 100 is a bottom emission type organic light emitting display device, the first, second, and third opposite electrode layers 133R, 133G, and 133B may reflect light emitted from the first, second, and third organic emission layers 131R, 131G, and 131B, and light from the first, second, and third organic emission layers 131R, 131G, and 131B may be transmitted or partially transmitted by the first, second, and third opposite electrode layers 133R, 133G, and 133B. In this case, the first, second, and third pixel electrodes 121R, 121G, and 121B may each be formed of a semi-permeable metal, for example, an alloy of magnesium Mg and silver Ag, a metal such as silver, aluminum, gold, platinum, or chromium, or an alloy containing the metals. When the first, second, and third pixel electrodes 121R, 121G, and 121B are formed of such a semi-permeable metal, the first, second, and third pixel electrodes 121R, 121G, and 121B may each have a thickness that may reach reflectivity of 5% or above and permeability of 50%. The first, second, and third opposite electrode layers 133R, 133G, and 133B may each be formed of a reflective metal, for example, a metal such as silver, aluminum, gold, platinum, or chromium, or an alloy containing the metal.

When the organic light emitting display device 100 is a dual emission type organic light emitting display device, light from the first, second, and third organic emission layers 131R, 131G, and 131B may be transmitted or partially transmitted by both of the first, second, and third pixel electrodes 121R, 121G, and 121B and the first, second, and third opposite electrode layers 133R, 133G, and 133B. In this case, both the first, second, and third pixel electrodes 121R, 121G, and 121B and the first, second, and third opposite electrode layers 133R, 133G, and 133B may each be formed of a semi-permeable metal, for example, an alloy of magnesium Mg and silver Ag, a metal such as silver, aluminum, gold, platinum, or chromium, or an alloy containing the metals.

Although not illustrated in FIG. 2, the first, second, and third pixel electrodes 121R, 121G, and 121B may each have a structure in which a lower transparent conductive layer, a metal layer, and an upper transparent conductive layer are sequentially stacked. The lower transparent conductive layer and/or the upper transparent conductive layer may be formed of a transparent metal compound, for example, indium-tin-oxide (ITO), amorphous-ITO, indium-zinc-oxide (IZO), or aluminum zinc oxide (AZO). The metal layer may be formed of a semi-permeable metal or a reflective metal.

Lights emitted from the first, second, and third organic emission layers 131R, 131G, and 131B may be reflected between the first, second, and third pixel electrodes 121R, 121G, and 121B and the first, second, and third opposite electrode layers 133R, 133G, and 133B and emitted. Here, a resonance phenomenon may be generated in the lights emitted from the first, second, and third organic emission layers 131R, 131G, and 131B according to an optical distance between the first, second, and third pixel electrodes 121R, 121G, and 121B and the first, second, and third opposite electrode layers 133R, 133G, and 133B.

In the first pixel unit 130R, the first auxiliary electrode 123R and the second auxiliary electrode 125R may be interposed between the first pixel electrode 121R and the first organic emission layer 131R. In the second pixel unit 130G, the first auxiliary electrode 123G may be interposed between the second pixel electrode 121G and the second organic emission layer 131G. In the third pixel unit 130B, the third organic emission layer 131B may be directly formed on the third pixel electrode 121B. The first auxiliary electrode 123R on the first pixel electrode 121R and the first auxiliary electrode 123G on the second pixel electrode 121G may have the same thickness.

The first auxiliary electrodes 123R and 123G and the second auxiliary electrode 125R may each be formed of a transparent metal compound, for example, ITO, amorphous-ITO, IZO, or AZO. The first auxiliary electrodes 123R and 123G and the second auxiliary electrode 125R may each be formed of different transparent metal compounds. For example, the first auxiliary electrodes 123R and 123G may be formed of amorphous-ITO and the second auxiliary electrode 125R may be formed of AZO or IZO.

The first auxiliary electrodes 123R and 123G and/or the second auxiliary electrode 125R may be selectively disposed in the first, second, and third pixel units 130R, 130G, and 130B so that an optical distance between the first, second, and third pixel electrodes 121R, 121G, and 121B and the first, second, and third opposite electrode layers 133R, 133G, and 133B may vary in each of the first, second, and third pixel units 130R, 130G, and 130B. For example, when the first pixel unit 130R emits red light, the second pixel unit 130G emits green light, and the third pixel unit 130B emits blue light, the optical distance between the first pixel electrode 121R and the first opposite electrode layer 133R may be longer than the optical distance between the second pixel electrode 121G and the second opposite electrode layer 133G. The optical distance between the second pixel electrode 121G and the second opposite electrode layer 133G may be longer than the optical distance between the third pixel electrode 121B and the third opposite electrode layer 133B.

According to the present embodiment, the first auxiliary electrodes 123R and 123G and/or the second auxiliary electrode 125R may be selectively disposed among the first, second, and third pixel units 130R, 130G, and 130B so that an organic light emitting display device having a resonance structure may be realized. In order to realize the resonance structure in the organic light emitting display device, the optical distances between the first, second, and third pixel electrodes 121R, 121G, and 121B and the first, second, and third opposite electrode layers 133R, 133G, and 133B may vary according to the wavelength of light emitted from the first, second, and third pixel units 130R, 130G, and 130B.

In each of the first, second, and third pixel units 130R, 130G, and 130B, the first, second, and third organic emission layers 131R, 131G, and 131B may be formed on the first, second, and third pixel electrodes 121R, 121G, and 121B, respectively. In an implementation, in the first pixel unit 130R, the first organic emission layer 131R is formed on the second auxiliary electrode 125R, in the second pixel unit 130G, the second organic emission layer 131G is formed on the first auxiliary electrode 123G, and, in the third pixel unit 130B, the third organic emission layer 131B is directly formed on the third pixel electrode 121B.

The first, second, and third organic emission layers 131R, 131G, and 131B may each be formed of a low molecular weight organic material or a polymer organic material. The first, second, and third organic emission layers 131R, 131G, and 131B may each have a single or multi-layered structure including at least one selected from the group consisting of a hole injection layer (HIL), a hole transport layer (HTL), an emission layer (EML), an electron transport layer (ETL), and an electron injection layer (EIL). The HIL may include copper phthalocyanine (CuPc), N,N'-Di(naphthalene-1-yl)-N, N'-diphenyl-benzidine (NPB), or tris-8-hydroxyquinoline aluminum (Alq3). The HTL may include poly(ethylenedioxythiophene) (PEDOT). The ETL may include a polycyclic hydrocarbon-based derivative, a heterocyclic compound, or tris-8-hydroxyquinoline aluminum (Alq3). The EIL may include LiF, Liq, NaF, or Nag.

When the first, second, and third pixel units 130R, 130G, and 130B emit red light, green light, and blue light, respectively, the first organic emission layer 131R of the first pixel unit 130R may include carbazole biphenyl (CBP) or mCP as a host material and may be formed of a phosphor as a dopant material including at least one selected from the group consisting of PIQIr(acac) (bis(1-phenylisoquinoline)acetylacetonate iridium), PQIr(acac) (bis(1-phenylquinoline)acetylacetonate iridium), PQIr (tris(1-phenylquinoline) iridium), and PtPEP (octaethylporphyrin platinum). Also, the first organic emission layer 131R may be formed of a fluorescent material such as PED:Eu(DBM)$_3$(Phen) or perylene.

Also, the second pixel unit 130G may include CBP or mCP as a host material and may be formed of a phosphor as a dopant material including Ir(ppy)$_3$ (fac tris(2-phenylpyridine) iridium). The second pixel unit 130G may be also formed of a fluorescent material such as tris-8-hydroxyquinoline aluminum (Alq3).

In addition, the third organic emission layer 131B of the third pixel unit 130B may be formed of a fluorescent material including at least one selected from the group of DPVBi, spiro-DPVBi, spiro-6P, distyryl benzene (DSB), distyryl arylene (DSA), a PFO-based polymer, and a PPV-based polymer.

The first, second, and third organic emission layers 131R, 131G, and 131B may be formed by using a general method such as laser induced thermal imaging (LITI), inkjet printing, or vacuum deposition.

Hereinafter, details of a method of manufacturing the organic light emitting display device 100 illustrated in FIG. 2 are described.

FIGS. 3 through 9 illustrate schematic cross-sectional diagrams of stages in a method of manufacturing the organic light emitting display device 100 of FIG. 2, according to an embodiment.

Figure 3:
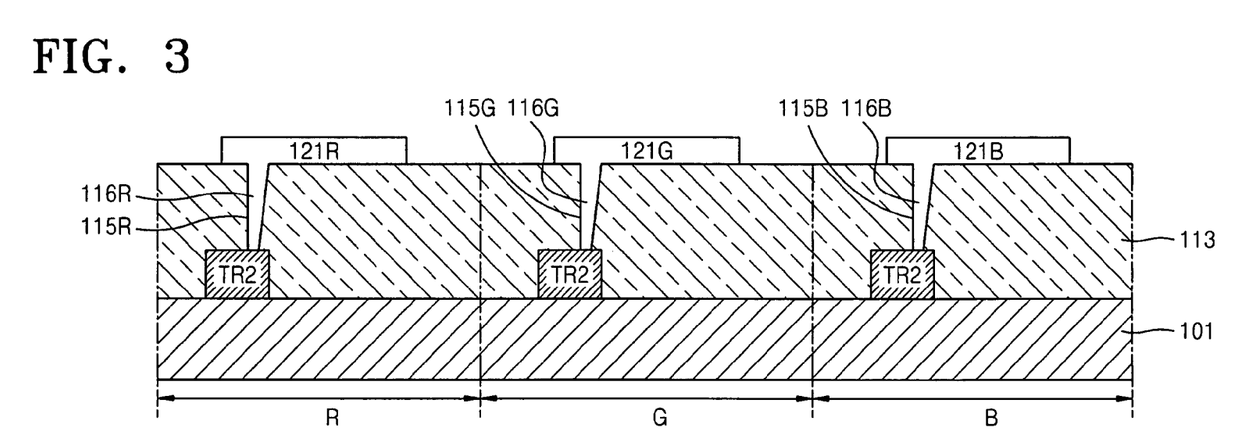
FIGS. 3 through 9 illustrate schematic cross-sectional diagrams of stages in a method of manufacturing the organic light emitting display device of FIG. 2, according to an embodiment.

Referring to FIG. 3, the driving thin film transistors TR2 may be formed on the base substrate 101 respectively in the first, second, and third regions R, G, and B. As stated above, in addition to the driving thin film transistors TR2, the switching thin film transistor TR1 and the storage capacitor Cst may be formed in each of the first, second, and third regions R, G, and B. The insulating layer 113 may be formed on the driving thin film transistors TR2.

The insulating layer 113 may have a passivation film (not illustrated) formed of a photosensitive organic material, for example, an acryl-based compound. The passivation film may be formed on the insulating layer 113. The insulating layer 113 may be selectively planarized in order to remove steps generated by lower structures. The insulating layer 113 may include via holes 115R, 115G, and 115B that respectively expose a part of the driving thin film transistors TR2, for example, the output terminals. In order to fill the via holes 115R, 115G, and 115B, a pixel electrode layer (not illustrated) may be formed on the insulating layer 113. The pixel electrode layer may be formed by sequentially stacking a first transparent conductive layer (not illustrated), a metal layer (not illustrated), and a second transparent conductive layer (not illustrated) in the stated order on the insulating layer 113. The pixel electrode layer may be patterned by using photolithography and thus the first, second, and third pixel electrodes 121R, 121G, and 121B may be formed in the first, second, and third regions R, G, and B, respectively. Also, via contacts 116R, 116G, and 116B that fill the via holes 115R, 115G, and 115B, respectively may be formed. The first, second, and third pixel electrodes 121R, 121G, and 121B may each be electrically connected to the driving thin film transistors TR2 through the via contacts 116R, 116G, and 116B, respectively. Regions where the first, second, and third pixel electrodes 121R, 121G, and 121B are respectively formed in the first, second, and third regions R, G, and B may be referred to as first, second, and third pixel regions. Regions where the first, second, and third pixel electrodes 121R, 121G, and 121B are not formed and thereby the upper surface of the insulating layer 113 is exposed may be referred to as pixel defining regions.

Figure 4:
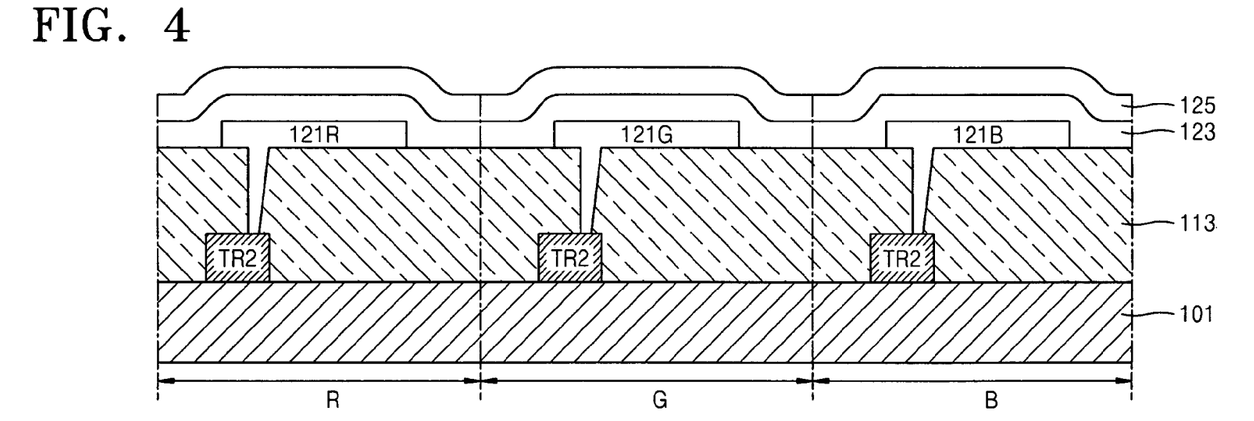

Referring to FIG. 4, a first auxiliary electrode layer 123 may be formed on the insulating layer 113 to cover the first, second, and third pixel electrodes 121R, 121G, and 121B. The first auxiliary electrode layer 123 may be formed of a material having etch selectivity with the first, second, and third pixel electrodes 121R, 121G, and 121B that may selectively etch the first, second, and third pixel electrodes 121R, 121G, and 121B. A second auxiliary electrode layer 125 may be formed on the first auxiliary electrode layer 123. As described above, the first auxiliary electrode layer 123 and the second auxiliary electrode layer 125 may each be formed of a transparent metal compound and may be formed different materials so that selective etching is possible. For example, the first auxiliary electrode layer 123 may be formed of amorphous-ITO and the second auxiliary electrode layer 125 may be formed of AZO or IZO.

Figure 5:
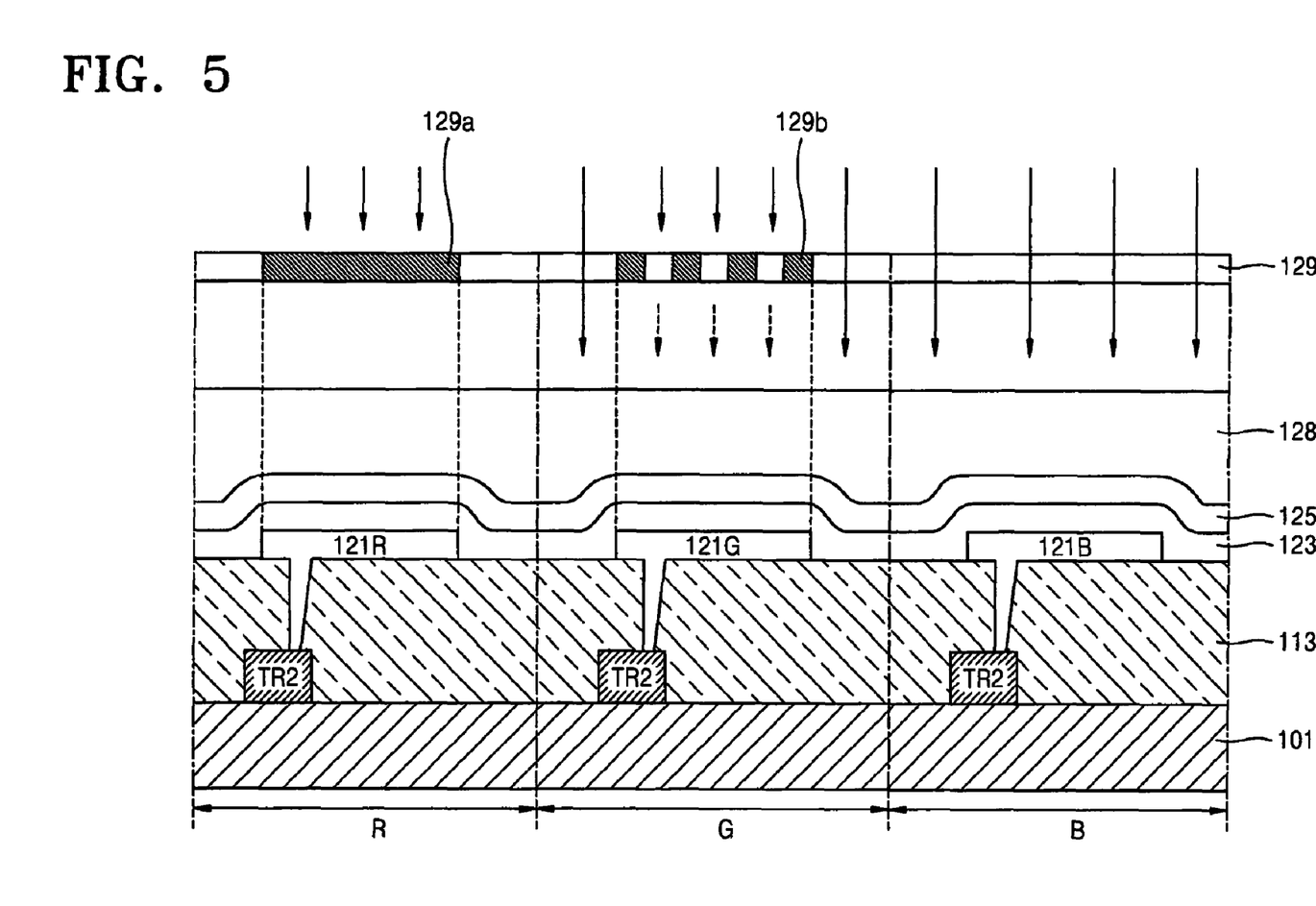

Referring to FIG. 5, a photosensitive layer 128 may be formed on the second auxiliary electrode layer 125. A half-tone mask 129 (or a grey-tone mask, a slit mask, or the like, hereinafter, referred to commonly as a 'half-tone mask') may be disposed on or above the photosensitive layer 128. The half-tone mask 129 may be a single mask that includes: a shaded region 129a, a half-tone region 129b, and a transparent region 129c. The shaded region 129a, the half-tone region 129b, and the transparent region 129c may correspond to the first, second, and third pixel regions, respectively. According to a characteristic of the photosensitive layer 128, the shaded region 129a and the transparent region 129c may be exchanged with each other. Hereinafter, it is described that the photosensitive layer 128 is a positive photosensitive layer.

In FIG. 5, the sizes of the shaded region 129a and the half-tone region 129b correspond to the first pixel region and the second pixel region, respectively. However, the shaded region 129a and the half-tone region 129b may be larger or smaller than the first pixel region and the second pixel region, respectively. For convenience of understanding of the invention, it is illustrated that the shaded region 129a and the half-tone region 129b correspond to the first pixel region and the second pixel region, respectively.

The photosensitive layer 128 may be exposed to light through the half-tone mask 129. In a single operation, the photosensitive layer 128 may be prevented from being exposed to light in the region corresponding to the shaded region 129a, may be half-tone exposed in the region corresponding to the half-tone region 129b, and may be completely exposed to light in the region corresponding to the transparent region 129c.

Figure 6:
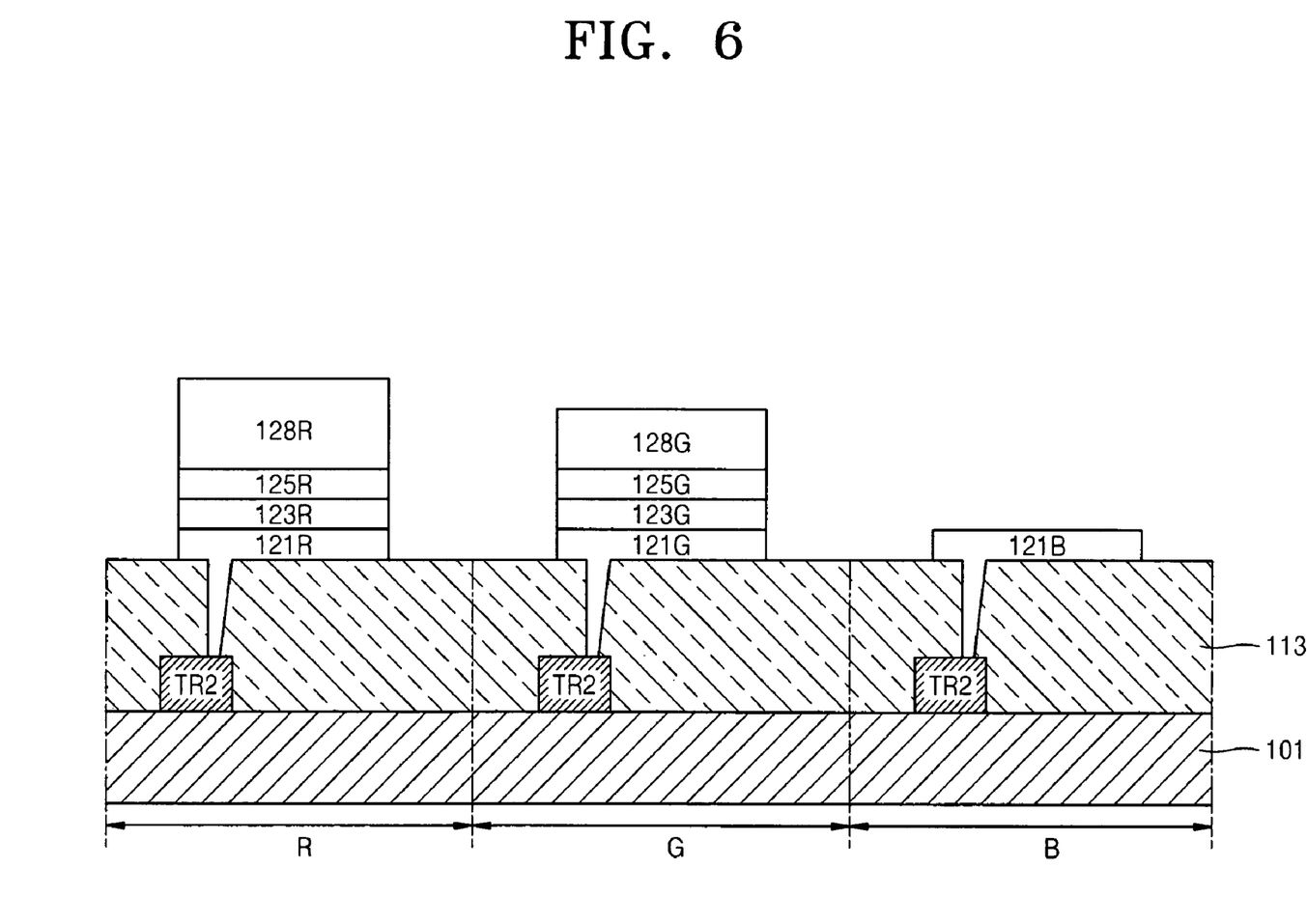

In further detail, referring to FIG. 6, the first auxiliary electrode 123R, the second auxiliary electrode 125R, and a photosensitive layer 128R are formed in the stated order on the first pixel electrode 121R. The first auxiliary electrode 123G, a second auxiliary electrode 125G, and a photosensitive layer 128G, from which a part thereof is removed, are formed in the stated order on the second pixel electrode 121G. The third pixel electrode 121B is exposed.

The photosensitive layer 128 may be exposed by using the half-tone mask 129 and developed so that the photosensitive layer 128R having the same thickness as the photosensitive layer 128 of FIG. 5 is formed in the region of the photosensitive layer 128 that corresponds to the shaded region 129a. The photosensitive layer 128G may have a smaller thickness obtained by removing part thereof, the photosensitive layer 128G being formed in the region of the photosensitive layer 128 that corresponds to the half-tone region 129b. The photosensitive layer 128 may be removed, e.g., completely, in the region that corresponds to the transparent region 129c, that is, on the third pixel region and the pixel defining region. Thus, regions of the photosensitive layer 128 corresponding to the red, green, and blue pixels may be exposed in a single operation and developed in a single operation.

The second auxiliary electrode layer 125 and the first auxiliary electrode layer 123 may be simultaneously or sequentially etched and removed by using the patterned photosensitive layers 128R and 128G as etching masks. As described above, as the second auxiliary electrode layer 125 and the first auxiliary electrode layer 123 may be patterned to form the first auxiliary electrode 123R and the second auxiliary electrode 125R on the first pixel electrode 121R, and form the first auxiliary electrode 123G and the second auxiliary electrode 125G on the second pixel electrode 121G.

Figure 7:
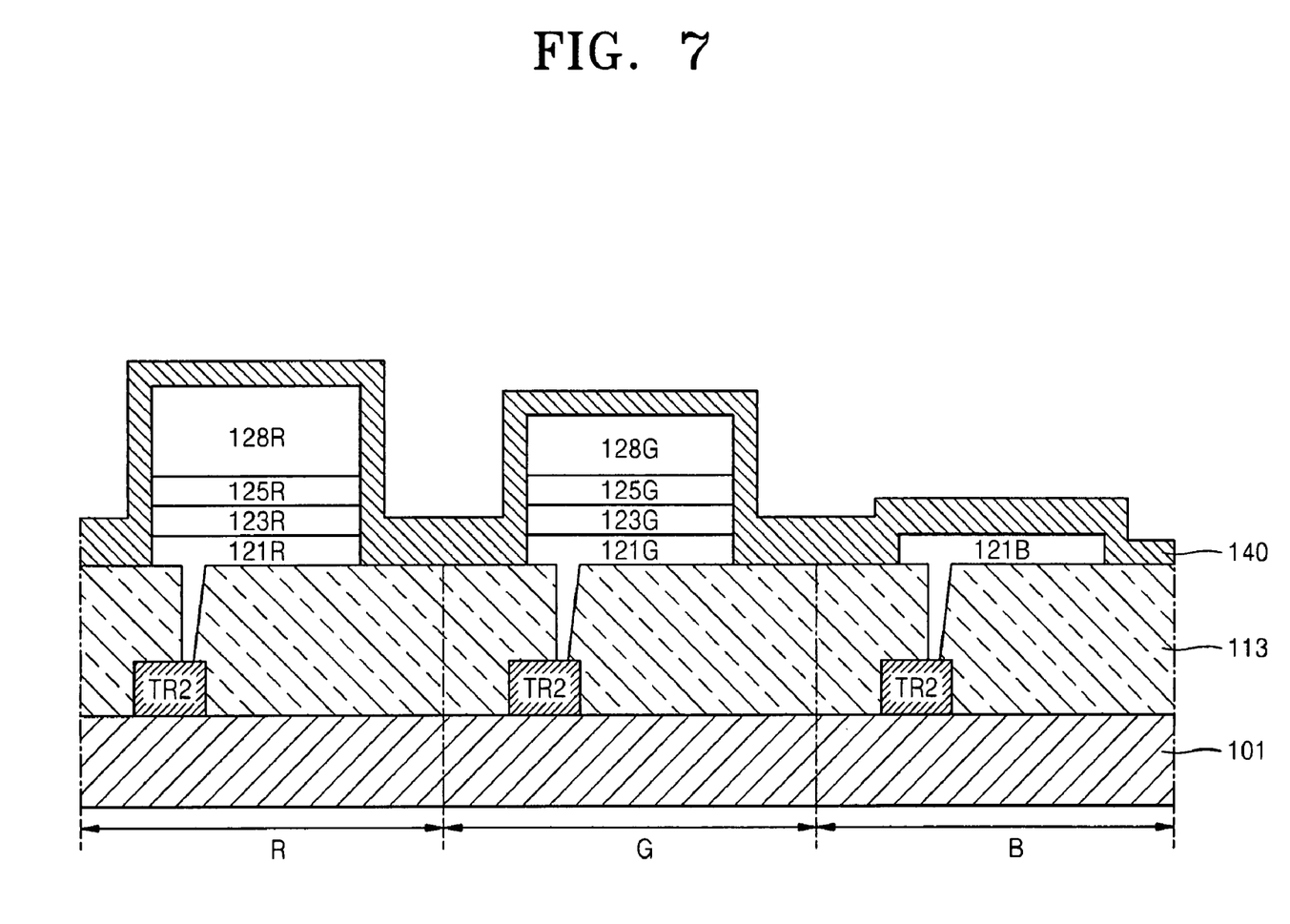

Referring to FIG. 7, an organic layer 140 may be coated to cover the above-described structures formed on the insulating layer 113. The organic layer 140 may be formed to cover the insulating layer 113 on the pixel defining regions, the third pixel electrode 121B on the third pixel region, and the photosensitive layers 128R and 128G. The organic layer 140 may be formed of the same material as the photosensitive layer 128 of FIG. 5. Also, the organic layer 140 may be removed during plasma ashing. The organic layer 140 may be thickly formed on the insulating layer 113 on the pixel defining regions, and on the third pixel electrode 121B on the third pixel region, due to the stepped structures formed on the insulating layer 113.

Figure 8:
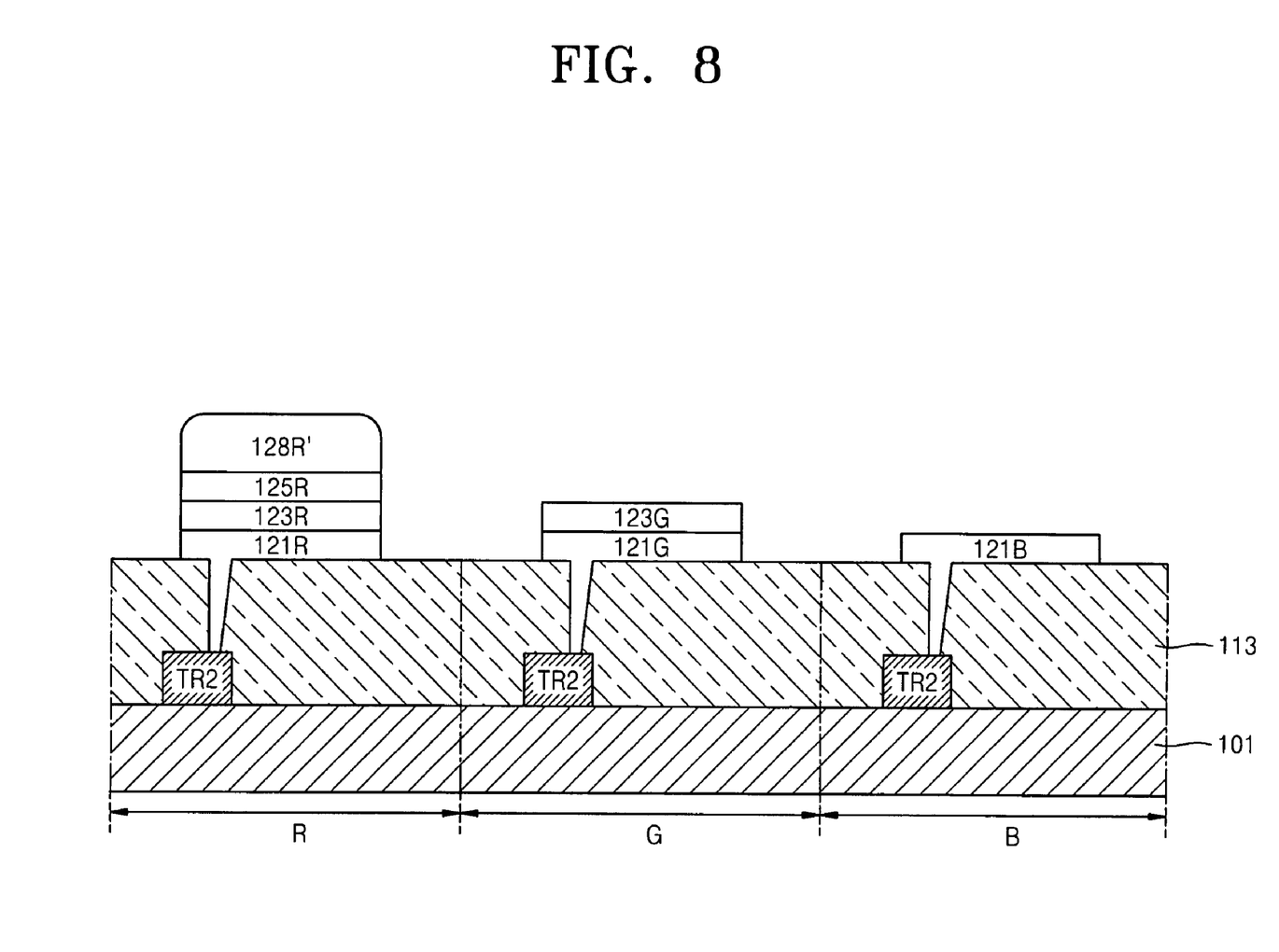

Referring to FIG. 8, the first auxiliary electrode 123R, the second auxiliary electrode 125R, and a photosensitive layer 128R', from which a part thereof is removed, may be formed in the stated order on the first pixel electrode 121R, the first auxiliary electrode 123G may be formed on the second pixel electrode 121G, and the third pixel electrode 121B may be exposed.

In further detail, the structure illustrated in FIG. 7, on which the organic layer 140 is coated, may be ashed by using plasma. In an example ashing process, oxygen $O_2$ is injected into a chamber where the structure of FIG. 7 is disposed and then radio frequency (RF) power is applied to the chamber, thereby causing glow discharge. Oxygen $O_2$ injected by the glow discharge is changed to oxygen radicals. The oxygen radicals are combined with carbon C and hydrogen H contained in the organic layer 140 and the photosensitive layers 128R and 128G, and carbon and hydrogen are gasified in the form of carbon dioxide ($CO_2$) and water ($H_2O$) so that the organic layer 140 and the photosensitive layer 128G may be removed and the photosensitive layer 128R may be partially removed. In such a plasma ashing process, if the insulating layer 113 is exposed, in particular, the insulating layer 113 including a layer formed of a photosensitive organic material such as an acryl-based compound, and the exposed third pixel electrode 121B, are directly exposed to plasma, they may be seriously damaged. However, the organic layer 140 is coated, and thus the insulating layer 113 and the third pixel electrode 121B on the pixel defining regions may be protected from the plasma.

Further to the above, as illustrated in FIG. 7, the organic layer 140 on the insulating layer 113 of the pixel defining regions and the organic layer 140 on the third pixel electrode 121B are disposed below the organic layer 140 on the photosensitive layers 128R and 128G, and thus may be removed slowly compared with the organic layer 140 on the photosensitive layers 128R and 128G. Also, the organic layer 140 on the insulating layer 113 of the pixel defining regions is disposed between stacked electrodes having relatively large thicknesses, and thus may be removed slowly compared with the organic layer 140 on the third pixel electrode 121B. In addition, the organic layer 140 may be relatively thick on the insulating layer 113 of the pixel defining regions due to the stepped structure, and thus may be maintained longer on the insulating layer 113 of the pixel defining regions. Accordingly, the organic layer 140 may protect the insulating layer 113 and the third pixel electrode 121B on the pixel defining regions from the plasma.

The thickness of the organic layer 140 may be selected so that the organic layer 140 on the insulating layer 113 of the pixel defining regions is completely removed when the photosensitive layer 128G and the organic layer 140 on the second pixel electrode 121G are completely removed.

After the ashing process, the organic layer 140 may be completely removed and the photosensitive layer 128G on the second pixel region may be completely removed. In an implementation, the photosensitive layer 128R on the first pixel region has a thickness larger than that of the photosensitive layer 128G on the second pixel region before the ashing process, and thus only a part of the photosensitive layer 128R on the first pixel region may be removed. The second auxiliary electrode 125G on the second pixel region may be removed by using the photosensitive layer 128R', from which a part thereof is removed, as an etching mask.

Figure 9:
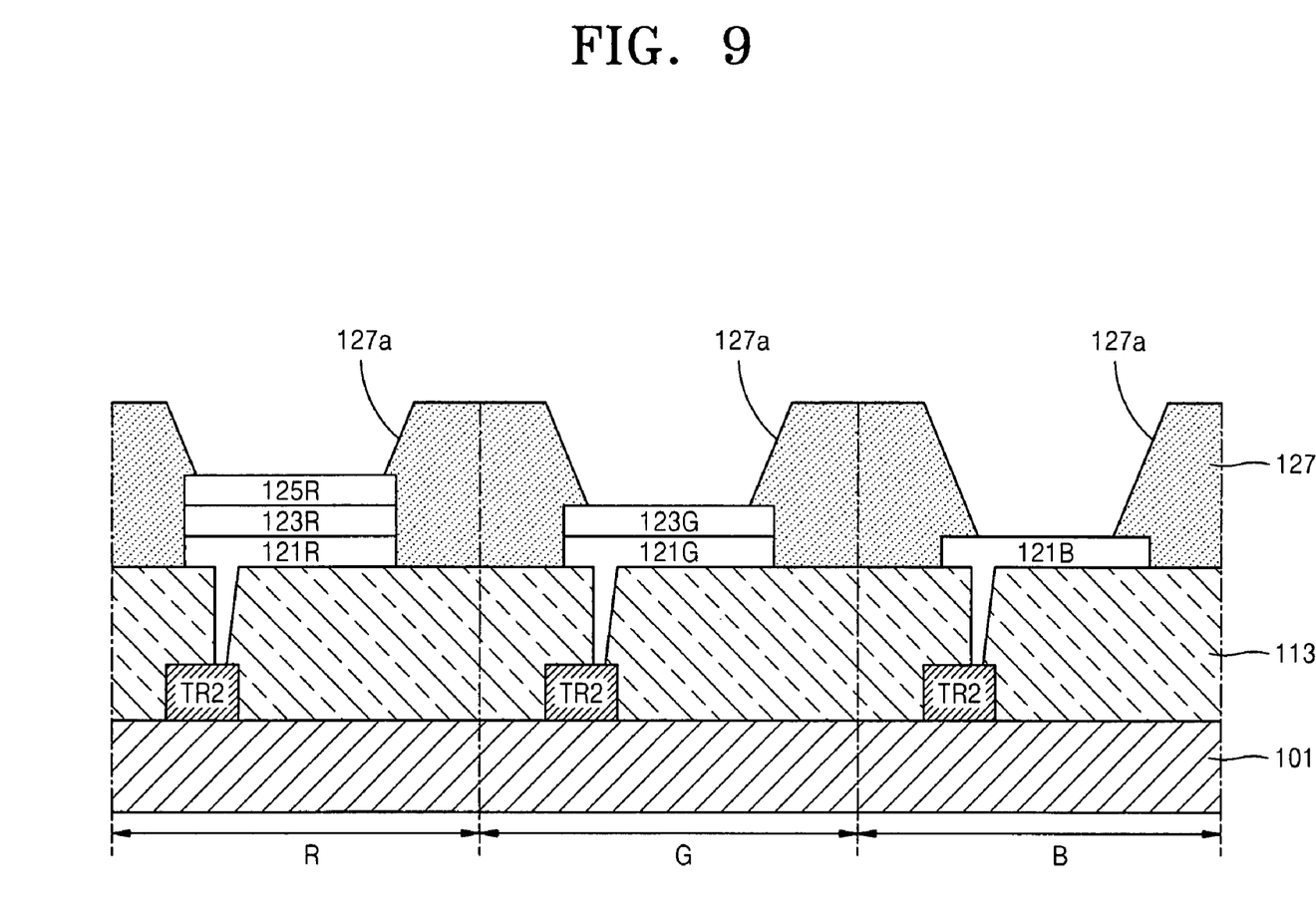

Referring to FIG. 9, the photosensitive layer 128R' that remained in the first pixel region may be removed. Then, a pixel defining layer 127 may be formed. The pixel defining layer 127 may include openings 127a which expose the second auxiliary electrode 125R on the first pixel region, the first auxiliary electrode 123G on the second pixel region, and the third pixel electrode 121B on the third pixel region.

Referring back to FIG. 2, the first organic emission layer 131R may be formed on the second auxiliary electrode 125R of the first pixel region. Also, the second organic emission layer 131G may be formed on the first auxiliary electrode 123G of the second pixel region. In addition, the third organic emission layer 131B may be formed on the third pixel electrode 121B of the third pixel region. The first, second, and third opposite electrode layers 133R, 133G, and 133B may be formed to cover the first, second, and third organic emission layers 131R, 131G, and 131B, respectively. The sealing member 103 for protecting the thin film transistors TR2 and the organic light emitting unit 130 may be formed on the organic light emitting unit 130.

As described above, embodiments relate to a method of manufacturing an organic light emitting display device, and more particularly, to a method of manufacturing an organic light emitting display device having a resonance structure so as to improve productivity and production yield. As described above, a half-tone mask may be used to manufacture the organic light emitting display device having a resonance structure, so that repetitious use of a fine metal mask may be avoided, and expensive and time-consuming photolithography processes may be reduced, thereby simplifying the manufacturing process. Also, plasma ashing may be used, such that an economic burden of chemical reagents may be reduced compared with wet etching, and environmental problems such as wastewater treatment may be mitigated. In addition, the organic layer may be coated such that the substrate and lower electrodes may be prevented from being damaged by the plasma ashing. Thus, a production yield of the organic light emitting display device may be improved.

In a method of manufacturing the organic light emitting display device according to an embodiment, a half-tone mask may be used in the manufacture of an organic light emitting display device having a resonance structure, and thus productivity of manufacturing may be increased. Also, the organic layer may be coated and then the plasma ashing process may be applied to the substrate so that damage to the substrate may be prevented and/or reduced, and defects of the organic light emitting display device may be reduced.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of manufacturing an organic light emitting display device, the method comprising:
   providing a substrate, the substrate including a first electrode on which a first photosensitive layer is formed, a second electrode on which a second photosensitive layer is formed, and an exposed third electrode;
   coating an organic layer on the substrate; and
   carrying out an ashing process to remove the organic layer and the second photosensitive layer and to partially remove the first photosensitive layer so as to avoid exposing the upper surface of the first electrode.

2. The method as claimed in claim 1, further comprising partially removing the second electrode using the first photosensitive layer that is partially removed as an etching mask, and then completely removing the first photosensitive layer that is partially removed.

3. The method as claimed in claim 2, further comprising, after completely removing the first photosensitive layer that is partially removed, forming a first organic emission layer on the first electrode, forming a second organic emission layer on the second electrode that is partially removed, and forming a third organic emission layer on the third electrode.

4. The method as claimed in claim 3, further comprising forming opposite electrodes on the first, second, and third organic emission layers, wherein the first electrodes and the opposite electrodes are configured such that light emitted from the first organic emission layer resonates between the first electrode and the opposite electrode, light emitted from the second organic emission layer resonates between the second electrode and the opposite electrode, and light emitted from the third organic emission layer resonates between the third electrode and the opposite electrode.

5. The method as claimed in claim 3, wherein the first organic emission layer emits red light, the second organic emission layer emits green light, and the third organic emission layer emits blue light.

6. The method as claimed in claim 1, wherein the first, second, and third electrodes include pixel electrodes, and the first and second electrodes are initially formed to each further include a first auxiliary electrode on the pixel electrode and a second auxiliary electrode on the first auxiliary electrode.

7. The method as claimed in claim 6, further comprising removing the second auxiliary electrode of the second electrode using the first photosensitive layer that is partially removed as an etching mask.

8. The method as claimed in claim 1, wherein the thickness of the first photosensitive layer is larger than the thickness of the second photosensitive layer.

9. A method of manufacturing an organic light emitting display device, the method comprising:
 providing a substrate, the substrate including a first pixel region, a second pixel region, a third pixel region, and pixel defining regions, a first pixel electrode being formed in the first pixel region, a second pixel electrode being formed in the second pixel region, and a third pixel electrode being formed in the third pixel region, the pixel defining regions being disposed between the first pixel region, second pixel region, and third pixel region;
 sequentially forming a first auxiliary electrode layer, a second auxiliary electrode layer, and a photosensitive layer in the stated order on the substrate;
 patterning the photosensitive layer so as to partially remove the photosensitive layer in the second pixel region so as to avoid exposing the second auxiliary electrode layer of the second pixel region while removing the photosensitive layer on the third pixel area and the pixel defining regions;
 etching the first and second auxiliary electrode layers using the patterned photosensitive layer as an etching mask, and then forming an organic layer on the substrate;
 carrying out an ashing process so as to partially remove the photosensitive layer in the first pixel region so as to avoid exposing the second auxiliary electrode layer in the first pixel region while removing the organic layer and the photosensitive layer in the second pixel region;
 removing the second auxiliary electrode layer in the second pixel region using the ashed photosensitive layer as an etching mask; and
 removing the ashed photosensitive layer.

10. The method as claimed in claim 9, further comprising:
 forming a first organic emission layer on the second auxiliary electrode layer of the first pixel region, a second organic emission layer on the first auxiliary electrode layer of the second pixel region, and a third organic emission layer on the third electrode of the third pixel region; and
 forming opposite electrode layers on the first, second, and third organic emission layers.

11. The method as claimed in claim 10, wherein the first electrodes and the opposite electrodes are configured such that light emitted from the first organic emission layer resonates between the first pixel electrode and the opposite electrode, light emitted from the second organic emission layer resonates between the second pixel electrode and the opposite electrode, and light emitted from the third organic emission layer resonates between the third pixel electrode and the opposite electrode.

12. The method as claimed in claim 10, wherein:
 the first, second, and third pixel electrodes include semi-permeable metal layers and the opposite electrode layer includes a reflective metal layer, or
 the first, second, and third pixel electrodes include reflective metal layers and the opposite electrode layer includes a semi-permeable metal layer, or
 the first, second, and third pixel electrodes and the opposite electrode layer include semi-permeable metal layers.

13. The method as claimed in claim 9, wherein the first auxiliary electrode layer and the second auxiliary electrode layer are formed of different transparent conductors.

14. The method as claimed in claim 9, wherein the first auxiliary electrode layer includes amorphous-Indium tin oxide (ITO) and the second auxiliary electrode layer includes aluminum-doped zinc oxide (AZO).

15. The method as claimed in claim 9, wherein the first, second, and third pixel electrodes each include a first ITO layer, a metal layer formed on the first ITO layer, and a second ITO layer formed on the metal layer, and wherein the metal layer is a reflective metal layer or a semi-permeable metal layer.

16. The method as claimed in claim 9, wherein the organic layer is formed of the same material as the photosensitive layer.

17. The method as claimed in claim 9, wherein patterning the photosensitive layer includes exposing the photosensitive layer using a single half-tone mask that includes a shaded region, a half-tone region, and a transparent region, the shaded region corresponding to the first pixel region, the half-tone region corresponding to the second pixel region, and the transparent region corresponding to the pixel defining region.

18. The method as claimed in claim 9, wherein:
 the substrate includes:
  a plurality of thin film transistors each of which is electrically respectively connected to the first, second, and third pixel electrodes; and
  an insulating layer disposed on the plurality of thin film transistors, and
 the first, second, and third pixel electrodes are formed on the insulating layer to be spaced apart from each other in a matrix form.

19. The method as claimed in claim 18, wherein the insulating layer includes an acryl-based compound and the organic layer protects the insulating layer in the ashing process.

20. A method of manufacturing an organic light emitting display device, the method comprising:
 providing a substrate, the substrate including a first pixel region, a second pixel region, a third pixel region, and pixel defining regions, a first pixel electrode being formed in the first pixel region, a second pixel electrode being formed in the second pixel region, and a third pixel electrode being formed in the third pixel region, the pixel defining regions being disposed between the first pixel region, the second pixel region, and the third pixel region;

sequentially forming a first auxiliary electrode layer, a second auxiliary electrode layer, and a photosensitive layer in the stated order on the substrate;

forming a first photosensitive layer pattern so as to partially remove the photosensitive layer in the second pixel region so as to avoid exposing the second auxiliary electrode layer of the second pixel region while removing the photosensitive layer on the third pixel region and the pixel defining regions;

removing the first and second auxiliary electrode layers in the third pixel region and the pixel defining regions using the first photosensitive layer pattern, and then forming an organic layer on the substrate;

forming a second photosensitive layer pattern so as to remove the organic layer and to partially remove the photosensitive layer in the first pixel region so as to avoid exposing the second auxiliary electrode layer of the first pixel region while removing the photosensitive layer on the second pixel region;

removing the second auxiliary electrode layer in the second pixel region by using the second photosensitive layer pattern as an etching mask; and removing the second photosensitive layer pattern.

* * * * *